United States Patent
Lin et al.

(10) Patent No.: US 7,129,119 B2
(45) Date of Patent: *Oct. 31, 2006

(54) METHOD FOR FABRICATING SEMICONDUCTOR PACKAGES

(75) Inventors: Ying-Ren Lin, Tantzu (TW); Ho-Yi Tsai, Tantzu (TW); Chien-Ping Huang, Tantzu (TW)

(73) Assignee: Siliconware Precision Industries Co., Ltd., Tantzu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/049,054

(22) Filed: Feb. 1, 2005

(65) Prior Publication Data
US 2005/0287713 A1    Dec. 29, 2005

(30) Foreign Application Priority Data
Jun. 24, 2004    (TW) ............................... 93118242 A

(51) Int. Cl.
*H01L 21/50*    (2006.01)
(52) U.S. Cl. .................. 438/113; 438/108; 438/109; 438/110; 438/114; 257/678; 257/684; 257/710
(58) Field of Classification Search ........... 438/113, 438/114, 108, 107, 110; 257/678, 684, 710
See application file for complete search history.

(56) References Cited

U.S. PATENT DOCUMENTS 6,038,136 A    3/2000  Weber
6,444,498 B1    9/2002  Huang et al.
6,699,731 B1    3/2004  Huang et al.
6,830,957 B1*   12/2004  Pu et al. ............... 438/108
2005/0287707 A1*   12/2005  Lin et al. ............... 438/113

FOREIGN PATENT DOCUMENTS

TW    559960    11/2003

* cited by examiner

*Primary Examiner*—Brook Kebede
*Assistant Examiner*—Su C. Kim

(57) ABSTRACT

A method for fabricating semiconductor packages is proposed. A plurality of substrates are prepared each having a chip thereon. Length and width of each substrate are equal to predetermined length and width of the semiconductor package. A carrier having a plurality of openings is prepared. A protruded portion is formed at each corner of each opening, wherein a distance between two diagonal protruded portions is slightly larger than that between two diagonal corners of the substrate. The substrates are fixed in the openings of the carrier by means of the protruded portions, and gaps between the substrates and the carrier are sealed. An encapsulant is formed over each opening to encapsulate the corresponding chip by a molding process. An area on the carrier covered by the encapsulant is larger in length and width than the opening. A plurality of the semiconductor packages are formed after performing mold-releasing and singulation processes.

24 Claims, 17 Drawing Sheets

METHOD FOR FABRICATING SEMICONDUCTOR PACKAGES

FIELD OF THE INVENTION

The present invention relates to methods for fabricating semiconductor packages, and more particularly, to a fabrication method of ball grid array semiconductor packages using a substrate carrier.

BACKGROUND OF THE INVENTION

A flip-chip ball grid array (FCBGA) semiconductor package is a package structure comprising both a flip chip and a ball grid array, wherein an active surface of at least one chip is electrically connected to a surface of a substrate via a plurality of solder bumps in a flip-chip manner, and a plurality of solder balls are implanted on an opposite surface of the substrate to serve as input/output (I/O) connections. This package structure yields significant advantages to effectively decrease the package size, reduce resistance and improve electrical performances without using conventional bonding wires, thereby preventing decay of signals during transmission. Therefore, the FCBGA semiconductor package has become a mainstream package product for chips and electronic elements of the next generation.

Referring to FIG. 10, the above FCBGA semiconductor package comprises a substrate 70; a chip 71 mounted on and electrically connected to an upper surface of the substrate 70 in a flip-chip manner; and a plurality of solder balls 72 implanted on a lower surface of the substrate 70 to be electrically connected to an external device. This package further comprises an encapsulant 73 formed on the upper surface of the substrate 70 by a molding process to encapsulate the chip 71. The related prior arts include U.S. Pat. Nos. 6,038,136, 6,444,498 and 6,699,731 and Taiwanese Patent No. 559960, which have disclosed similar package structures for improving the electrical performances of packages and satisfying the requirements for advanced electronic products.

However, the FCBGA semiconductor package still causes significant drawbacks in its fabrication processes. During the molding process of forming the encapsulant 73, in order to firmly fix the substrate 70 in an opening 77 of a substrate carrier 75 (as shown in FIG. 11) and prevent resin flashes on the substrate 70 as well as facilitate a subsequent mold-releasing process, the substrate 70 usually needs to be sized larger to have additional length and width. After the molding process is complete, extra portions in length and width of the substrate 70 are cut off according to a predetermined substrate size (for example, 31 mm×31 mm shown in FIG. 10) required for the semiconductor package. The discarded extra portions of the substrate 70 not only cause a material waste but also increase the material and fabrication costs.

Referring to FIG. 11, in U.S. Pat. No. 6,830,957, a clamping area a is extended from each side of the substrate 70, making the size of the substrate 70 larger than that of a mold cavity 81 of an encapsulating mold 80, such that the substrate 70 can be well clamped by the mold 80. As a result, the encapsulant 73 would not flash to the lower surface of the substrate 70 and not damage the bondability of ball pads 74 on the substrate 70 for implanting the solder balls 72. However, such design obviously increases the size of the substrate 70. For a single conventional package with the substrate 70 having the size of 31 mm×31 mm (as shown in FIG. 10), a distance of the clamping area a should be at least 0.6 mm to provide a good flash-preventing effect. Therefore, an additional portion of 1.2 mm that is to be eventually cut off is included respectively in the length and width of the substrate 70, which thus increases materials required for the substrate 70 and also increases the overall fabrication cost of the package (the substrate cost is generally more than 60% of the overall cost of the flip-chip package).

Furthermore, in accordance with the singulated package product shown in FIG. 10, the cost of the substrate 70 used in the molding process would further be increased. In order to successfully release the mold 80 when the molding process is complete, as shown in FIG. 12, a mold-releasing angle 82 is formed on an edge of the encapsulant 73 in contact with the substrate 70 by the shape of the mold cavity 81. Generally, the mold-releasing angle 82 should not be larger than 60° to provide a satisfactory mold-releasing effect. For a single package with the substrate 70 having the size of 31 mm×31 mm, an additional length or width b of at least 0.58 mm is required for the substrate 70 to accommodate the encapsulant 73 having the mold-releasing angle 82, such that an additional portion of 1.16 mm that is to be eventually cut off is included respectively in the length and width of the substrate 70, together with a cutting path c of 0.6 (0.3×2) mm respectively in the length and width of the substrate 70 reserved for a singulation process. Therefore, the size of the substrate 70 required during fabrication of the package is (31+1.2+1.16+0.6)mm×(31+1.2+1.16+0.6) mm, instead of 31 mm×31 mm. This causes not only a waste of utilization of the substrate but also 15~20% increase in the overall cost.

The above problem leads to significant difficulty in the fabrication of the FCBGA semiconductor package. Although the molding process of forming the encapsulant 73 is an essential step for fabricating the package, it would effectively increase the size and material cost of the substrate 70 and is not advantageous for mass production. This thus sets a bottleneck in development of the FCBGA semiconductor package.

Therefore, the problem to be solved here is to provide a method for fabricating semiconductor packages, which can reduce the size and cost of a substrate, prevent resin flashes, and solve the mold-releasing problem, to satisfy requirements for mass production.

SUMMARY OF THE INVENTION

In light of the above prior-art drawbacks, a primary objective of the present invention is to provide a method for fabricating semiconductor packages, which does not require the size of a substrate to be increased and can reduce the fabrication cost.

Another objective of the present invention is to provide a method for fabricating semiconductor packages, which needs not cut off an edge portion of a substrate during a singulation process.

Still another objective of the present invention is to provide a method for fabricating semiconductor packages, by which a substrate can be easily fixed in a substrate carrier.

A further objective of the present invention is to provide a method for fabricating semiconductor packages, which can prevent resin flashes without increasing the size of a substrate.

In accordance with the above and other objectives, the present invention proposes a method for fabricating semiconductor packages, comprising the steps of: preparing a plurality of substrates, wherein length and width of each of the substrates are equal to predetermined length and width of the semiconductor package respectively, and each of the substrates is mounted with at least one chip on an upper surface thereof; subsequently, preparing a carrier having a plurality of openings, wherein each of the openings is formed with a protruded portion at each corner position thereof, and a distance between two diagonal protruded portions of each of the openings is slightly larger than that between two diagonal corners of each of the substrates; placing the plurality of substrates respectively into the plurality of openings, with the substrates being well fixed in the openings by means of the protruded portions of the corresponding openings, and sealing gaps between the substrates and the carrier to prevent an encapsulant from flashing to a lower surface of each of the substrates during a subsequent molding process; then, performing the molding process to form the encapsulant over each of the openings to encapsulate the corresponding chip, wherein an area on the carrier covered by the encapsulant is larger in length and width than the corresponding opening; performing a mold-releasing process; and finally, performing a singulation process to cut along edges of the substrates to form a plurality of the semiconductor packages.

The present invention allows the substrates to be embedded in the openings of the carrier via the protruded portions of the openings. The distance between two diagonal protruded portions of each of the openings is slightly larger than that between two diagonal corners of the corresponding substrate by 0.1–0.2 mm, preferably 0.1 mm. The protruded portion can be shaped as a triangle, a rectangle, or a fan, etc.

Moreover, the present invention uses a filling material such as a solder mask to fill and seal the gaps between the substrates and the carrier. Alternatively, at least one tape can be attached to the substrates and the carrier to cover all of the openings and the gaps between the substrates and the carrier, so as to prevent flashes of the encapsulant from occurrence.

The foregoing carrier can be made of an organic insulating material such as FR4, FR5, or BT (bismaleimide triazine), etc. Alternatively, a metal carrier can be used in the present invention to fabricate desirable semiconductor packages still in a cost-effective manner. This fabrication method comprises the steps of: preparing a plurality of substrates, wherein length and width of each of the substrates are equal to predetermined length and width of the semiconductor package respectively, and each of the substrates is mounted with at least one chip on an upper surface thereof; subsequently, preparing a metal carrier having a plurality of openings, wherein each of the openings is formed with a protruded portion at each corner position thereof, and a distance between two diagonal protruded portions of each of the openings is slightly larger than that between two diagonal corners of each of the substrates; then, placing the plurality of substrates respectively into the plurality of openings, with the substrates being well fixed in the openings by means of the protruded portions of the corresponding openings, and sealing gaps between the substrates and the metal carrier to prevent the gaps from penetrating the metal carrier; performing a molding process to form an encapsulant over each of the openings to encapsulate the corresponding chip, such that the corresponding substrate, chip and encapsulant form a single package unit, wherein an area on the metal carrier covered by the encapsulant is larger in length and width than the corresponding opening; performing a mold-releasing process; separating the package units from the metal carrier; and finally, performing a singulation process to cut along edges of the substrates to form a plurality of the semiconductor packages.

The foregoing metal carrier can be made of a copper (Cu) material, and a surface thereof is plated with a metal layer that is poorly adhesive to the encapsulant. The metal layer can be made of a metal material such as gold (Au), nickel (Ni), or chromium (Cr), etc. By virtue of the poor adhesion between the plated metal layer and the encapsulant, the package unit can be easily separated from the metal carrier, thereby providing convenience of fabrication.

Therefore, according to the foregoing arrangement, the length and width of the substrate in the present invention can be perfectly matched with the predetermined length and width of the package, such that no edge portion of the substrate would be cut off during singulation and a material waste is avoided. Furthermore, the resin-flash problem during molding and the mold-releasing problem can be solved by simply sealing the gaps between the substrates and the carrier, and allowing coverage of a mold cavity used for forming the encapsulant to be larger in length and width than the size of the opening. This does not require the size of the substrate to be undesirably increased and thus eliminates the drawbacks in the prior art.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

First Preferred Embodiment

Figure 1A:
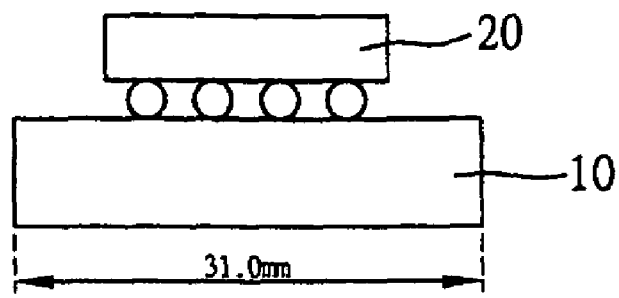
FIGS. 1A to 1K are schematic diagrams showing steps of a method for fabricating semiconductor packages according to a first preferred embodiment of the present invention.
Figure 1B:
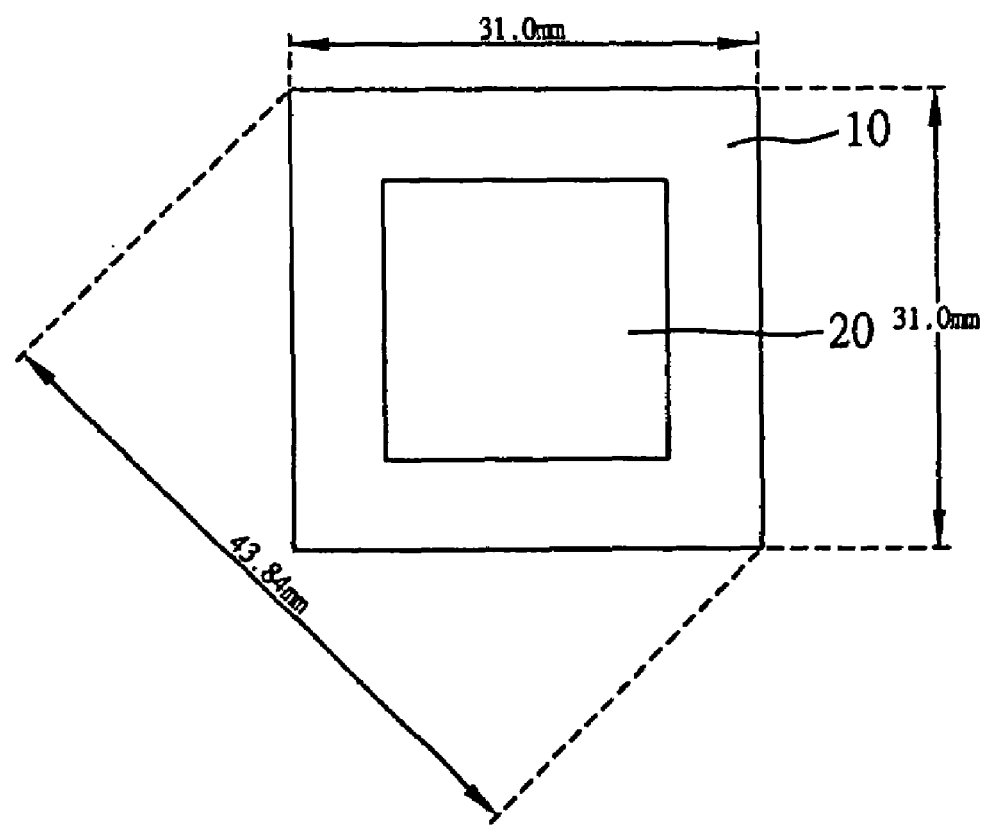

FIGS. 1A to 1K show a method for fabricating semiconductor packages according to a first preferred embodiment of the present invention. First referring to FIG. 1A, a plurality of build-up substrates 10 (only one is shown) each carrying a chip 20 thereon are prepared. The length and width of each of the substrates 10 are approximately equal to predetermined length and width of the final semiconductor package 1 (shown in FIG. 1K) respectively. In this embodiment, the predetermined dimensions of the semiconductor package 1 after singulation are 31 mm×31 mm in length and width, such that the length and width of the substrate 10 are also sized as 31 mm×31 mm, and a diagonal of the substrate 10 is 43.84 mm long as shown in FIG. 1B.

Figure 1C:
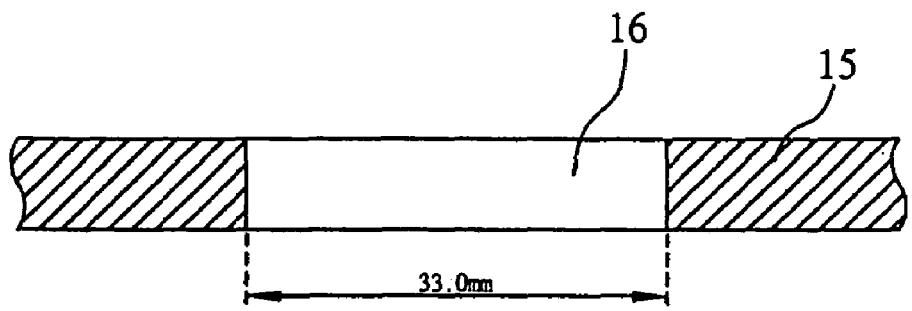
Figure 1D:
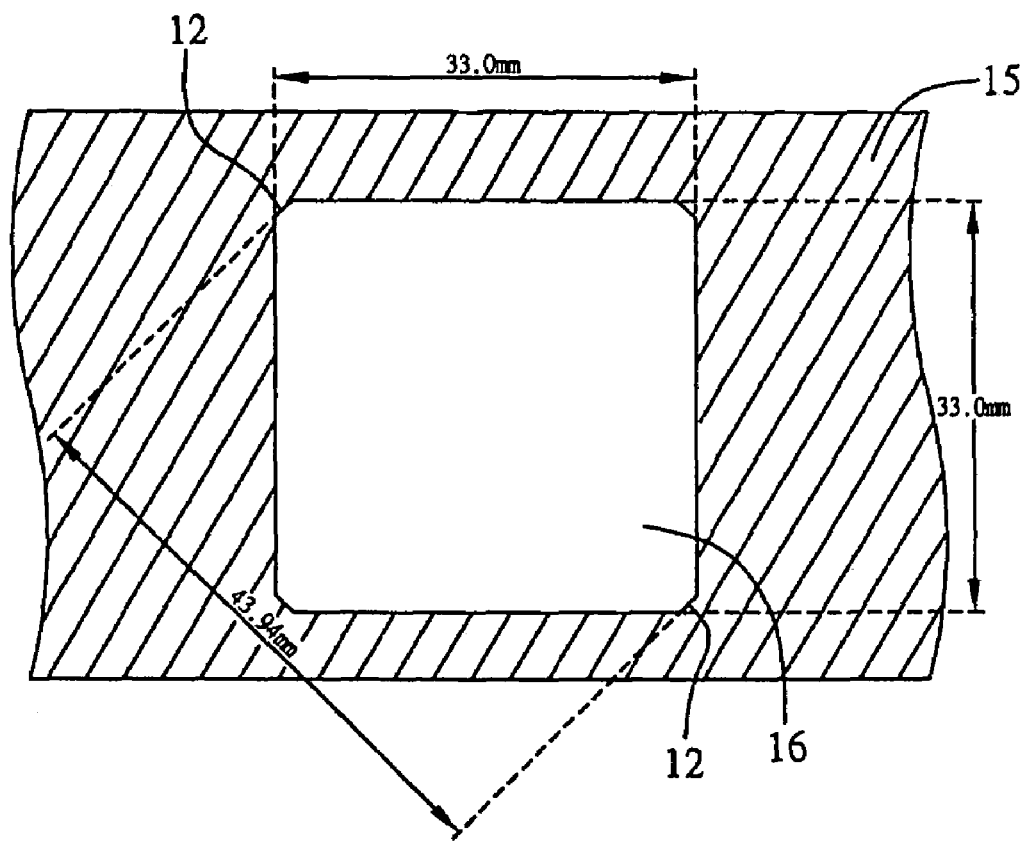

Referring to FIG. 1C, a substrate carrier 15 having a plurality of rectangular openings 16 (only one is shown) is prepared. As shown in FIG. 1D, a protruded portion 12 is provided at each corner position of each of the openings 16, and a distance between two diagonal protruded portions 12 of the opening 16 is slightly larger than that between two diagonal corners of the substrate 10 (i.e. the diagonal length of the substrate 10) so as to allow the substrate 10 to be embedded and fixed in the corresponding opening 16. In this embodiment, the opening 16 is shaped as a rectangle with length and width dimensions of 33 mm×33 mm, and the protruded portion 12 is shaped as a right triangle, wherein the distance between two diagonal protruded portions 12 is 43.94 mm, which is 0.1 mm larger than the diagonal length of the substrate 10.

Figure 1E:
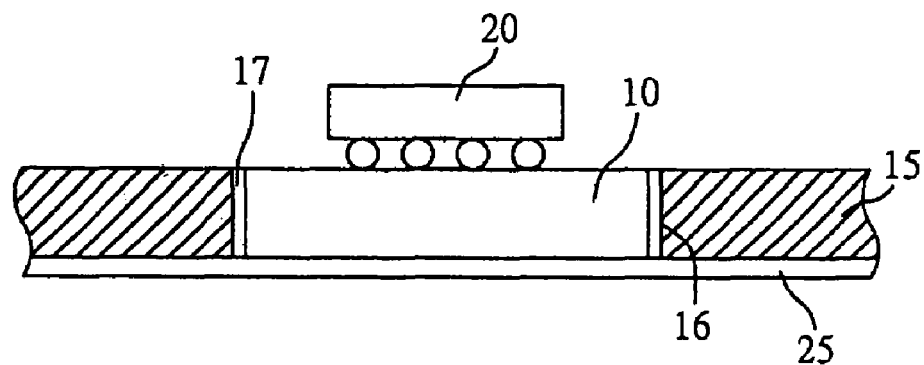
Figure 1F:
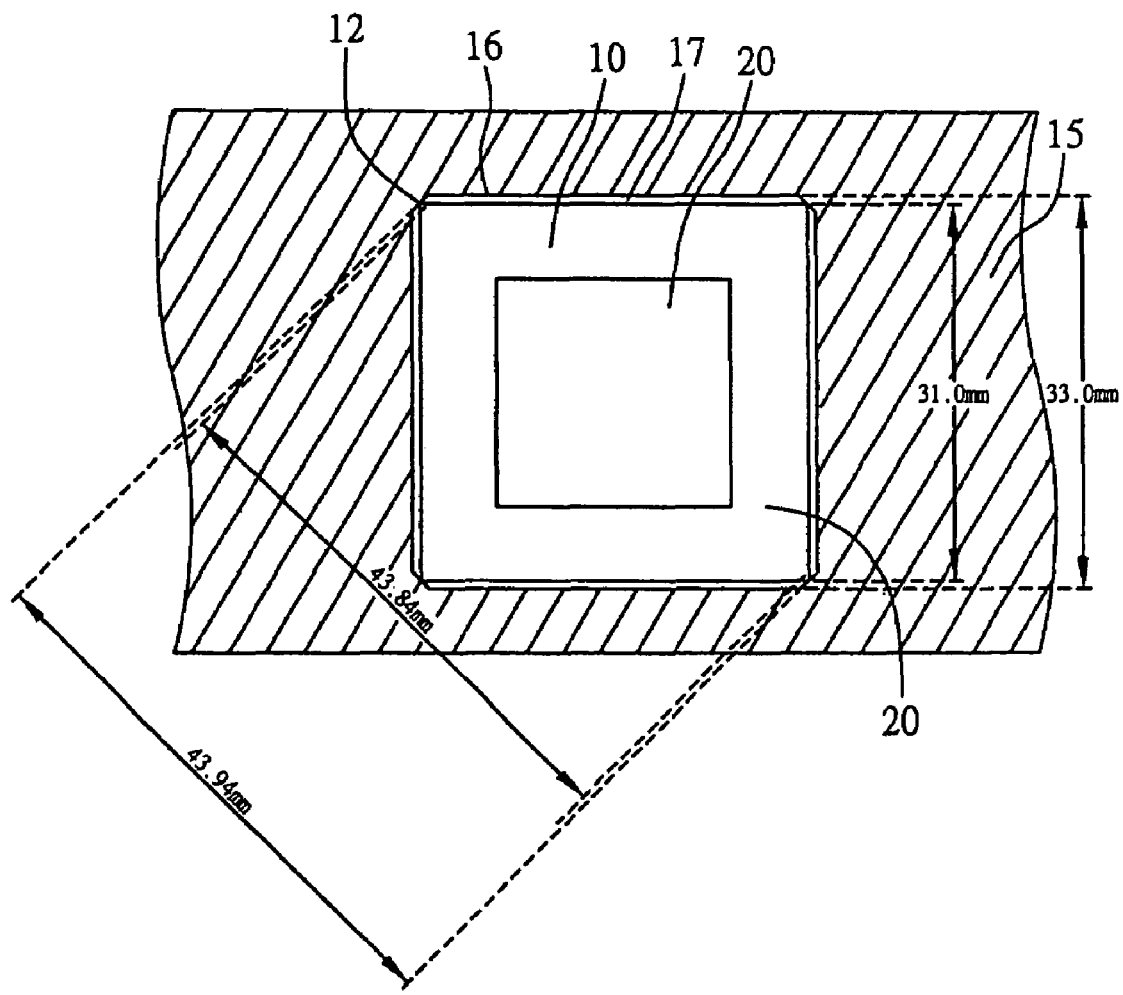

Referring to FIGS. 1E and 1F (FIG. 1F is a top view of FIG. 1E), the plurality of substrates 10 are embedded and fixed in the plurality of corresponding openings 16 (only one is shown) of the carrier 15 by means of the dimensional difference between the protruded portions 12 of the opening 16 and the corners of the substrate 10 (the distance between two diagonal protruded portions 12 of the opening 16 is 43.94 mm, and the diagonal length of the substrate 10 is 43.84 mm). As a result, the corners of the substrate 10 abut against the corresponding protruded portions 12 of the opening 16, making the substrate 10 well positioned in the opening 16. Further, gaps 17 between the substrates 10 and the carrier 15 are sealed and would not penetrate the carrier 15. As shown in FIG. 1E, in this embodiment, a tape 25 is attached to lower surfaces of the substrates 10 and the carrier 15 to cover the gaps 17. The tape 25 can be made of a thermally resistant polymer material.

Figure 1G:
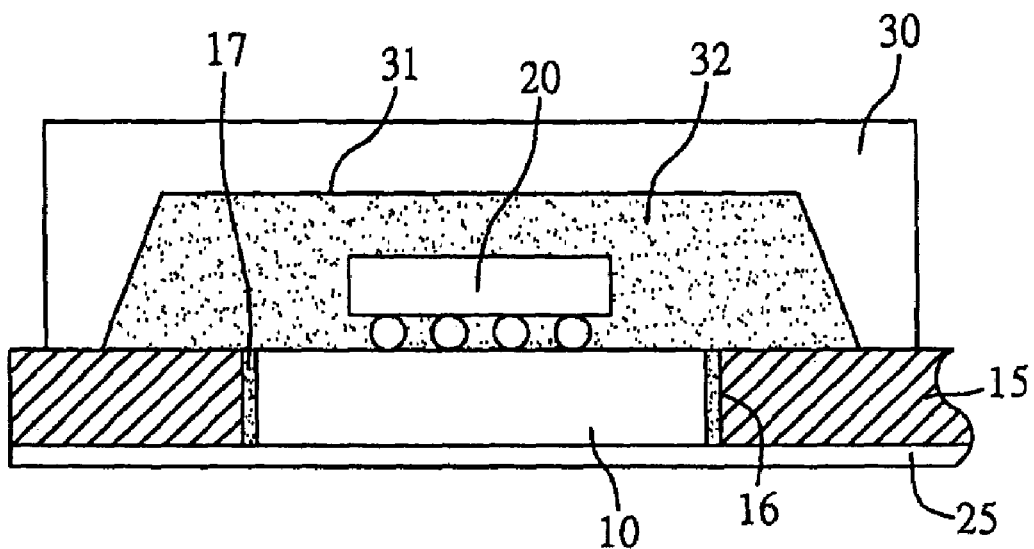

Referring to FIG. 1G, a conventional molding process is performed to place the carrier 15 into a mold 30, allowing each of the chips 20 to be received in a corresponding mold cavity 31, so as to form an encapsulant 32 (made of a resin material) over each of the openings 16 to encapsulate the corresponding chip 20. In the present invention, the dimension (31 mm) of the substrate 10 is equal to the predetermined dimension (31 mm) of the semiconductor package 1 after singulation, and the opening 16 is sized slightly larger than the substrate 10 to have the substrate 10 being embedded therein. Moreover, as shown in FIG. 1G, an area on the carrier 15 covered by the encapsulant 32 is much larger in length and width than the opening 16. Although the encapsulant 32 injected into the mold cavity 31 would flow into the gap 17 between the substrate 10 and the carrier 15, the tape 25 is able to prevent the encapsulant 32 from flashing to the lower surface of the substrate 10. Thus, the substrate 10 in the present invention needs not to be sized larger to prevent resin flashes or facilitate releasing of the mold 30 (since a mold-releasing angle of the encapsulant 32 corresponds to an area of the carrier 15 not the substrate 10). Further with the provision of protruded portions 12 of the opening 16 for fixing the substrate 10, the length and width of the substrate 10 in the present invention can be made exactly the same as the predetermined length and width of the final package 1, without having to reserve any edge portion of the substrate 10 for being cut off during singulation, thereby effectively reducing the material cost of the substrate 10.

Figure 1H:
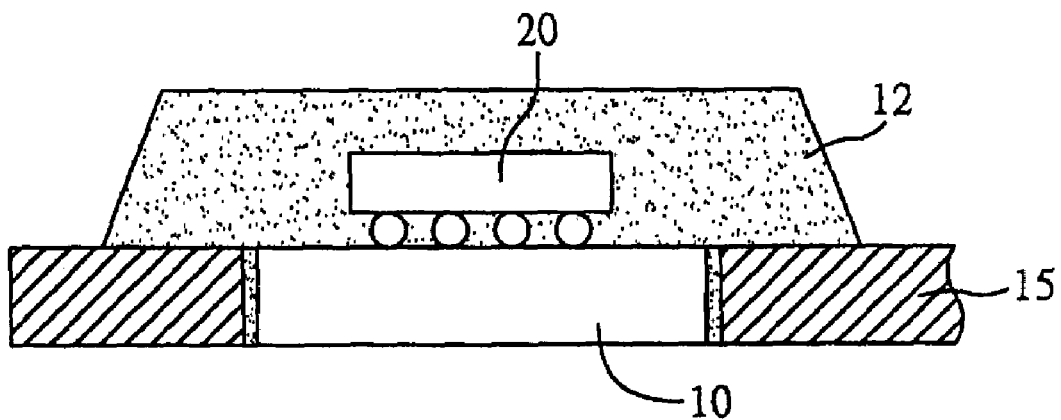
Figure 1I:
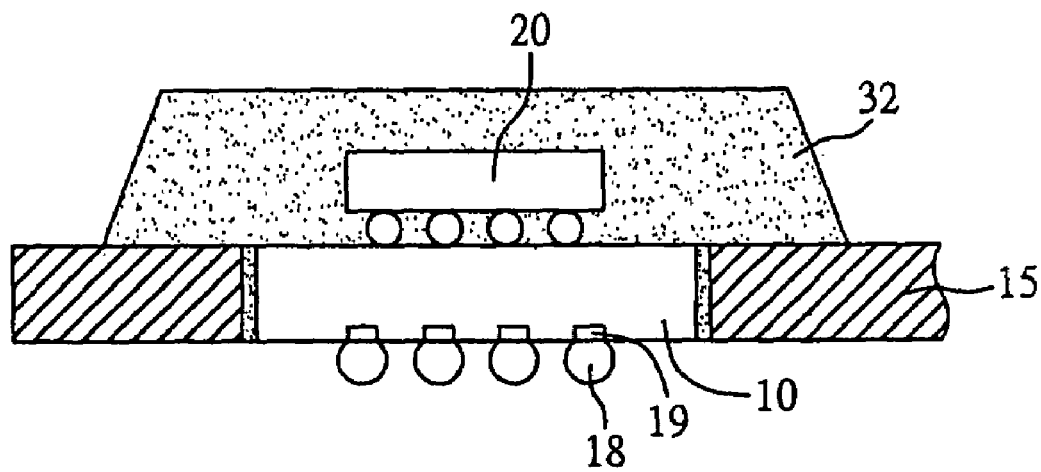
Figure 1J:
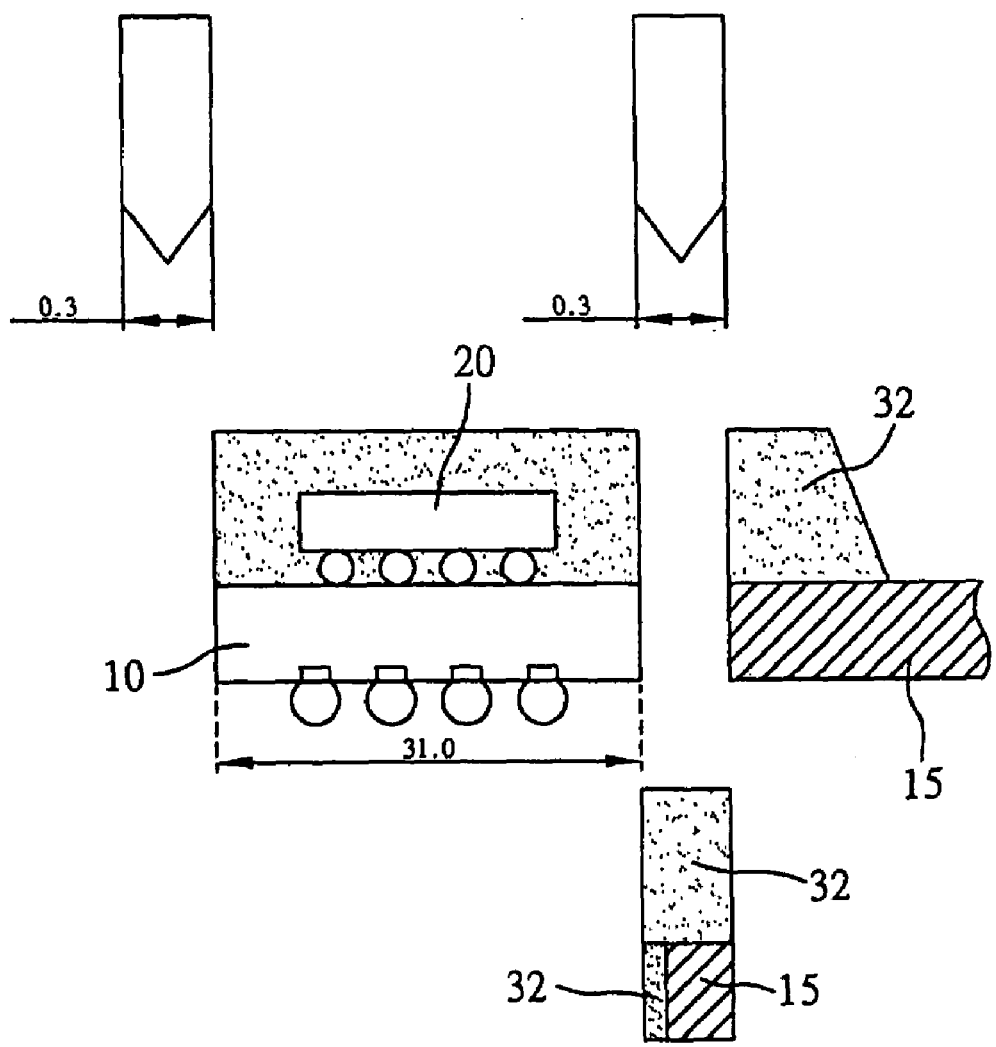
Figure 1K:
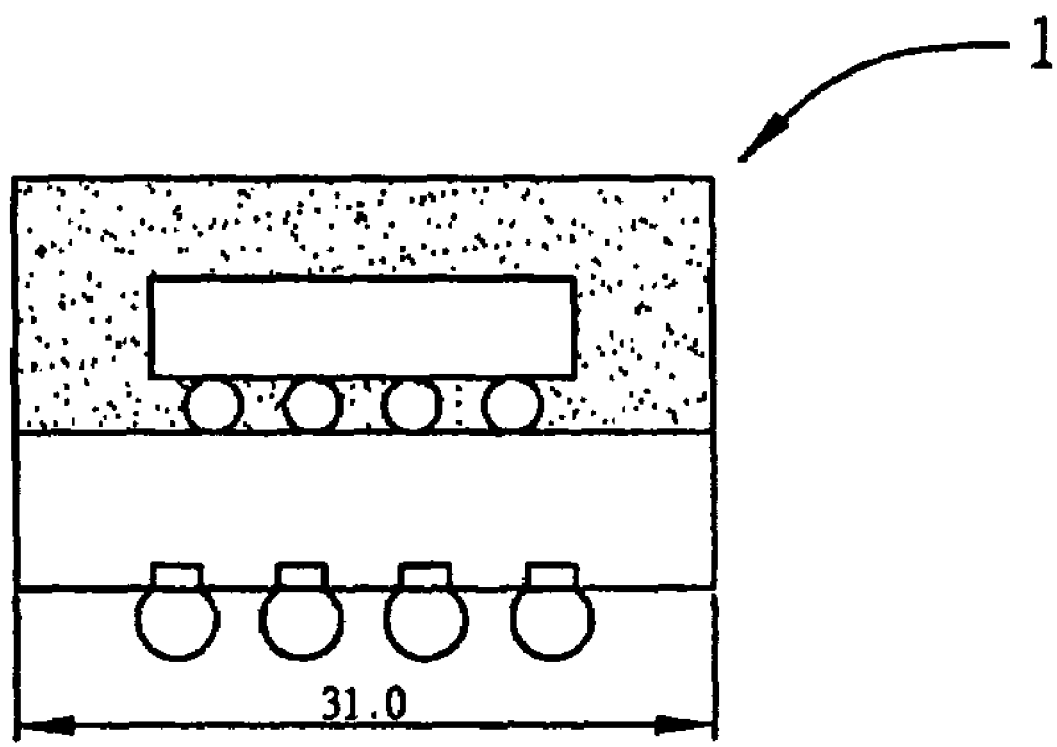
Figure 12:
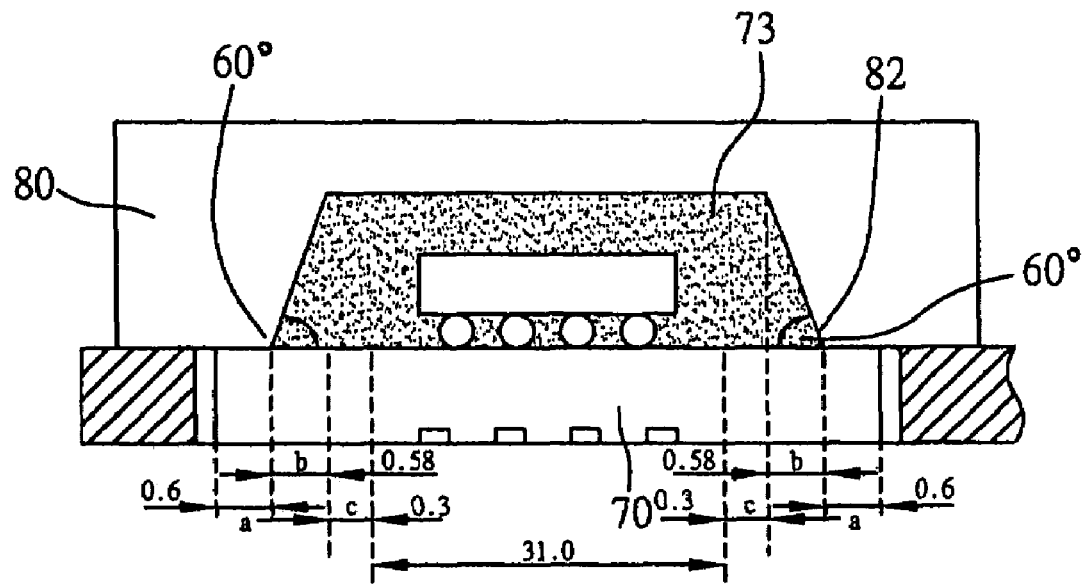

Referring to FIG. 1H, a mold-releasing process is performed to remove the mold 30, and then the tape 25 is removed. Referring to FIG. 1I, a plurality of solder balls 18 are implanted at ball pads 19 on a surface (lower surface) of each of the substrates 10 free of mounting the chip 20, such that the chip 20 can be electrically connected to an external device via the solder balls 18. Further, referring to FIG. 1J, a singulation process is performed to cut along edges of each of the substrates 10 according to the predetermined dimensions of the package 1 (i.e. the dimensions of the substrate 10). In this embodiment, since the predetermined dimensions of the package 1 and the dimensions of the substrate 10 are both 31 mm×31 mm, no extra material of the substrate 10 would be cut off or included in a cutting path (0.3 mm wide) or a discarded portion of the carrier 15 as shown in FIG. 1J, thereby eliminating a material waste of the substrate 10. Unlike the prior art shown in FIG. 12 that after the 0.3 mm cutting path is cut off from the substrate 70, still a portion of 1.18 mm (0.6 mm+0.58 mm) extra material of the substrate 70 is included with the carrier 75 to be discarded, the present invention can effectively reduce an used amount of the substrate material. Moreover, referring to FIG. 1K, a plurality of the semiconductor packages 1 fabricated with low costs are formed after the singulation process.

According to the foregoing embodiment, in the present invention, the relatively smaller substrates 10 are firstly fixed in the corresponding openings 16 of the carrier 15 by means of the protruded portions 12 at the corners of the openings 16. Then, the gaps 17 between the substrates 10 and the carrier 15 are sealed to prevent flashes of the encapsulants 32, and the coverage of the mold cavity 31 for forming the encapsulant 32 is larger in length and width than the size of the opening 16 to facilitate releasing of the mold 30. This does not require the size of the substrate 10 to be increased and can solve the prior-art problems of clamping substrates and in the molding process. As a result, the substrate 10 in the present invention can be reduced in size to allow the length and width of the substrate 10 to be equal to the predetermined length and width of the package 1, without causing any material waste of the substrate 10 after the singulation process.

For the semiconductor package 1 with length and width of 31 mm×31 mm, the distance between two diagonal protruded portions 12 of the opening 16 of the carrier 15 is not limited to 43.94 mm. Instead, this distance can be larger by 0.1–0.2 mm than the diagonal length (43.84 mm) of the substrate 10. Moreover, the carrier 15 can be made of an organic insulating material such as FR4, FR5, or BT (bismaleimide triazine), etc.

Figure 2:
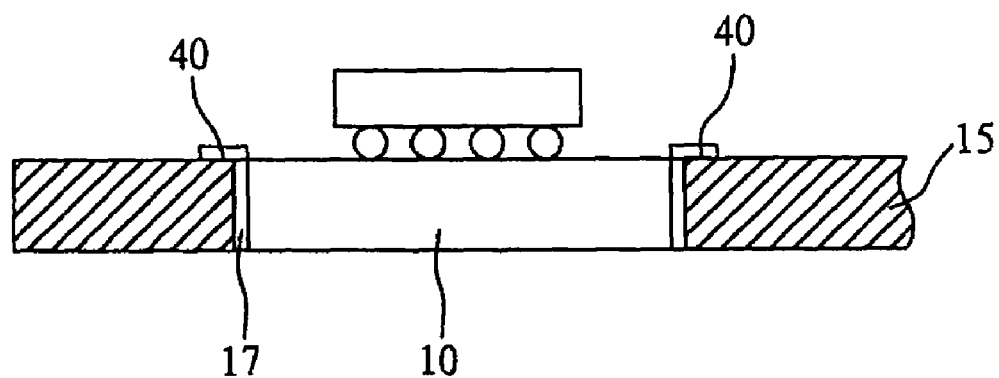
FIG. 2 is a cross-sectional diagram showing another method of sealing a gap between a substrate and a carrier according to the present invention.
Figure 3:
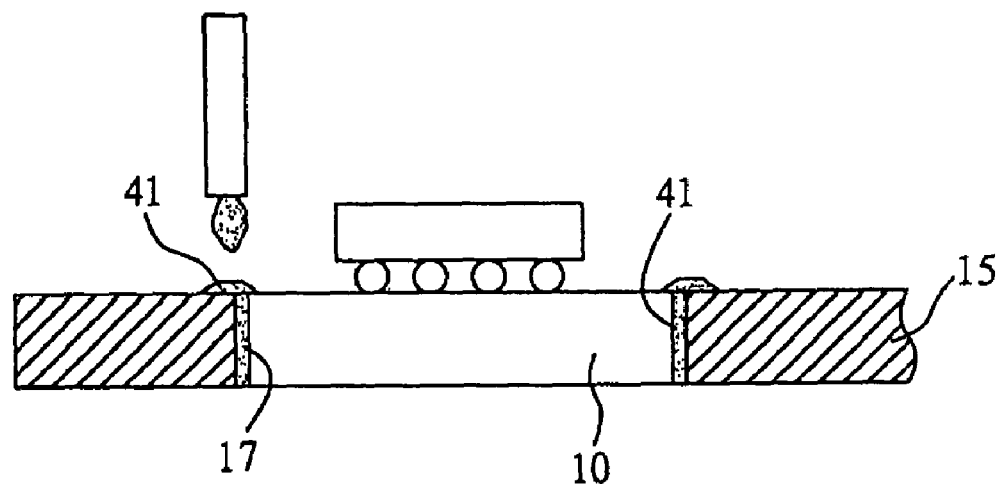
FIG. 3 is a cross-sectional diagram showing a further method of sealing the gap between the substrate and the carrier according to the present invention.

Additionally, there are some other methods suitable for fixing the substrates 10 in the openings 16 of the carrier 15 and sealing the gaps 17 between the substrates 10 and the carrier 15. Apart from the foregoing embodiment of attaching the tape 25 to the lower surfaces of the substrates 10 and the carrier 15, another method shown in FIG. 2 can be employed in which a plurality of small tapes 40 are used to directly cover and seal the gaps 17 between the substrates 10 and the carrier 15 respectively, thereby reducing an used amount of the tape material. These small tapes 40 can also be removed after the mold-releasing process. Moreover, a further method shown in FIG. 3 is to fill a filling material 41 such as a solder mask in the gaps 17 between the substrates 10 and the carrier 15 using a dispensing technique so as to fix the substrates 10 in the openings 16 and seal the gaps 17 to thereby prevent resin flashes. Alternatively, the filling material 41 can be a polymer material such as epoxy resin.

Second Preferred Embodiment

Apart from the carrier 15 being made of the organic insulating material such as FR4, FR5 or BT, a metal carrier having a metal layer plated on a surface thereof can also be used in the present invention. The metal layer is made of a material that is poorly adhesive to the encapsulant 32. FIGS. 4A to 4J show a method for fabricating semiconductor packages by using the metal carrier. In this embodiment, the predetermined dimensions of the semiconductor package 1, the dimensions of the substrate 10 and the size of openings 46 of the metal carrier 45 are all consistent with those in the foregoing first embodiment. Only the material used for the carrier 45 and some of the fabrication processes in this embodiment differ from those of the first embodiment.

Figure 4A:
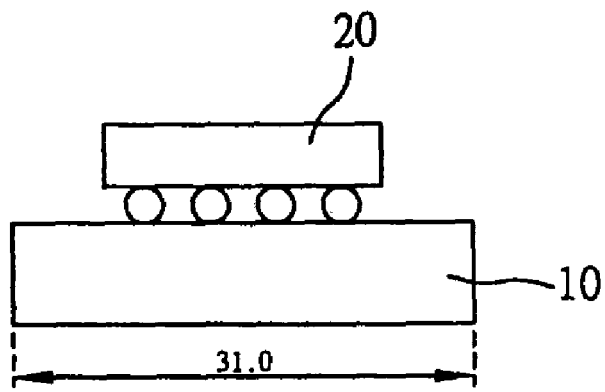
FIGS. 4A to 4J are schematic diagrams showing steps of a method for fabricating semiconductor packages according to a second preferred embodiment of the present invention.
Figure 4B:
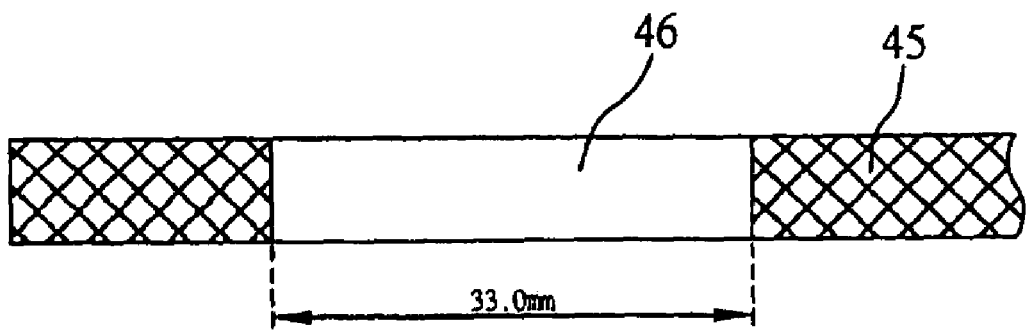
Figure 4C:
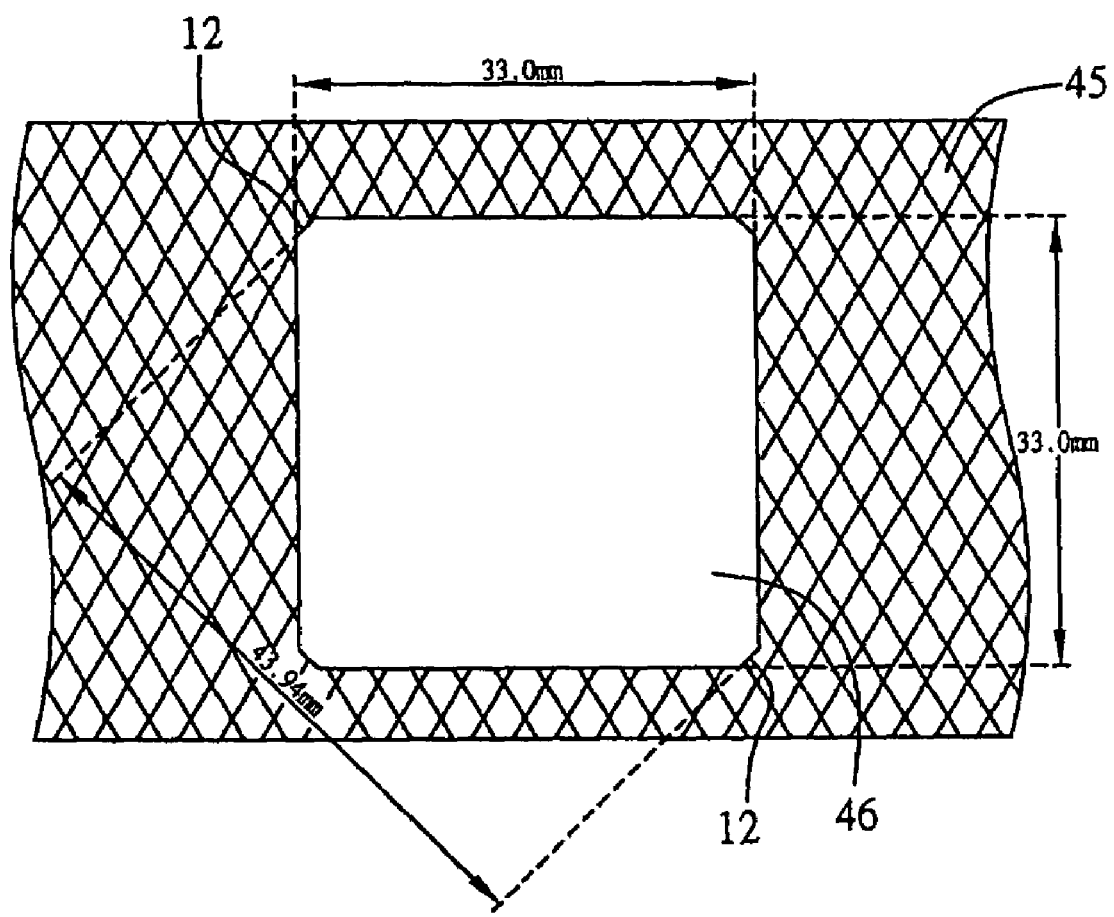
Figure 4D:
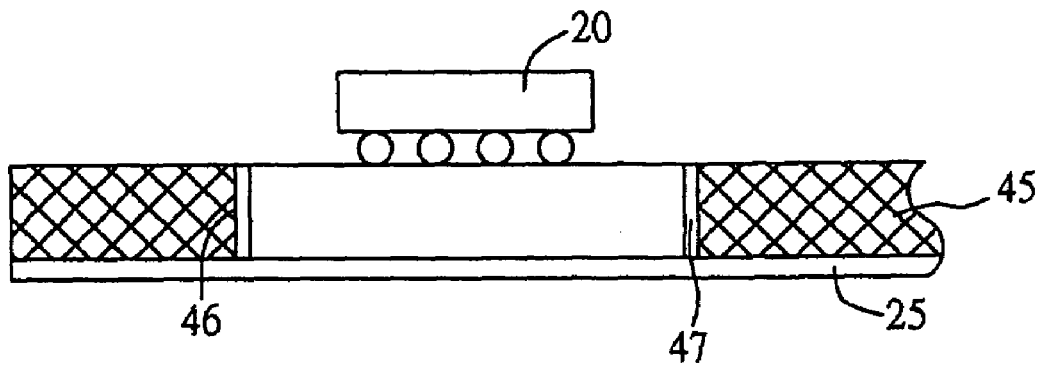
Figure 4E:
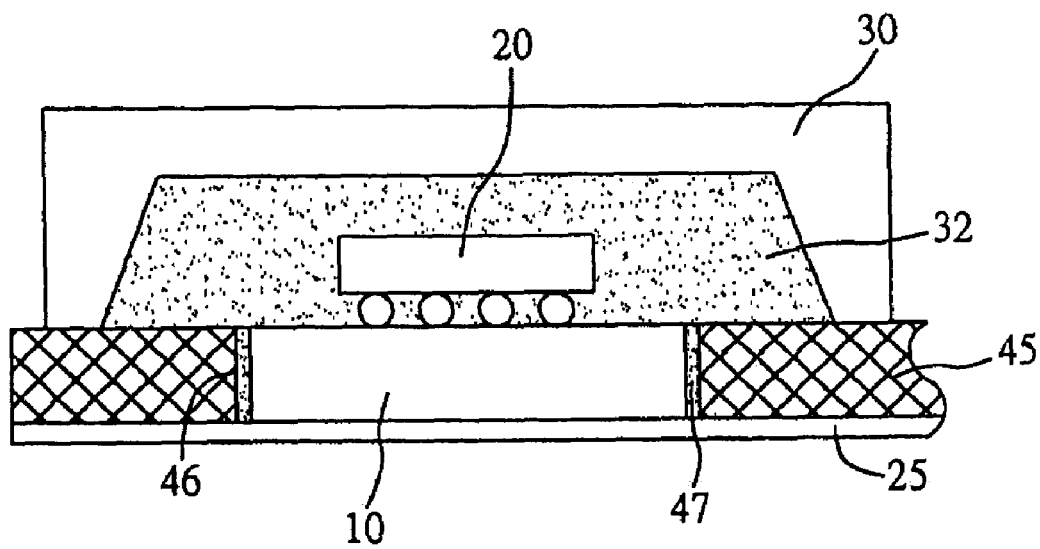
Figure 4F:
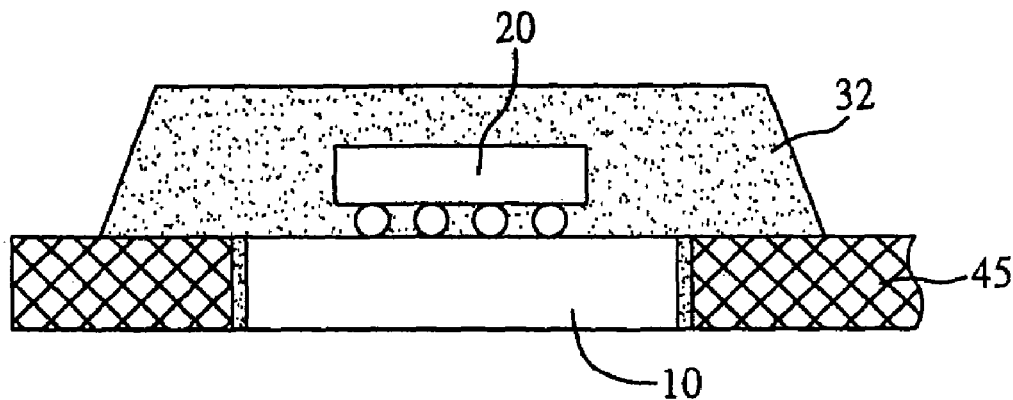

First referring to FIG. 4A, a plurality of build-up substrates 10 (only one is shown) each carrying a chip 20 thereon are prepared. The length and width of each of the substrates 10 are made equal to the predetermined length and width of the final semiconductor package 1 (shown in FIG. 4J), i.e. 31 mm×31 mm. Referring to FIG. 4B, a substrate carrier 45 having a plurality of openings 46 (only one is shown) is prepared. As shown in a top view of FIG. 4C, a protruded portion 12 is similarly provided at each corner position of each of the openings 46, wherein a distance between two diagonal protruded portions 12 of the opening 46 is slightly larger than the diagonal length of the substrate 10. The carrier 45 is made of a metal material such as copper (Cu). A metal layer such as gold (Au), nickel (Ni), or chromium (Cr), etc. poorly adhesive to an encapsulant 32 is in advance plated on a surface of the carrier 45. Referring to FIGS. 4D, 4E and 4F, the plurality of substrates 10 are embedded and fixed in the plurality of corresponding openings 46 (only one is shown) of the carrier 45 by means of the protruded portions 12 of the openings 46. A tape 25 is used to seal gaps 47 between the substrates 10 and the carrier 45, making the gaps 47 not penetrate the carrier 45. Subsequently, a molding process is performed to form the encapsulant 32 over each of the openings 46. Finally, a mold-releasing process is performed and the tape 25 is removed; these steps are similar to those in the foregoing first embodiment. Similarly, the problems of resin flashes and mold-releasing can be solved without increasing the size of the substrate 10 by this embodiment of the present invention.

Figure 4G:
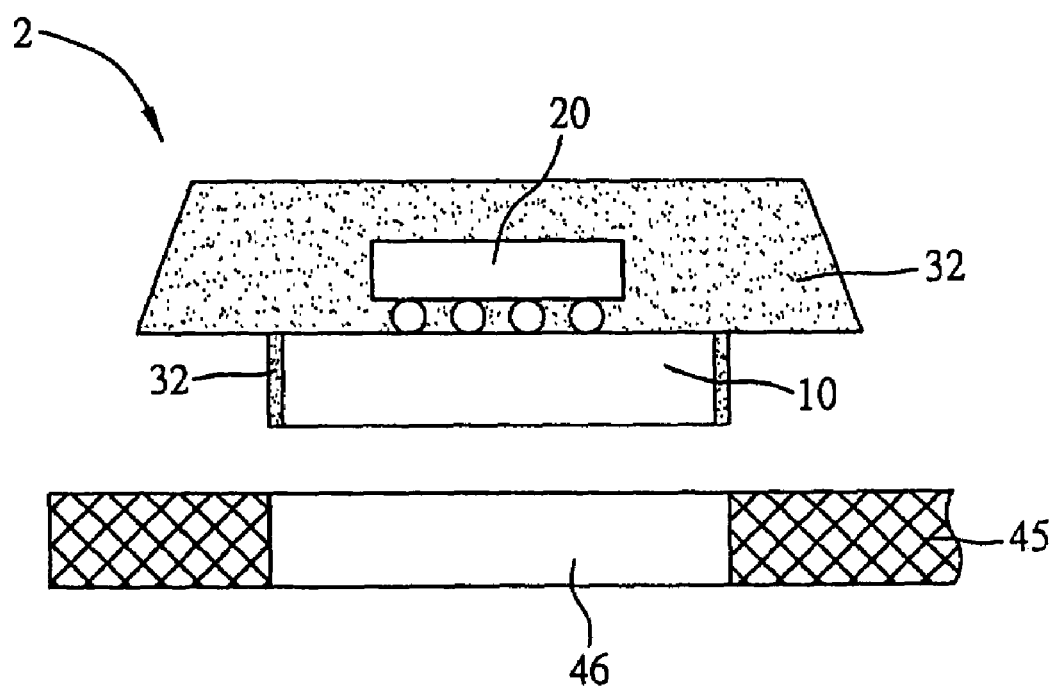

Since the carrier 45 has been plated with the metal layer that is poorly adhesive to the encapsulant 32, the adhesion between the encapsulant 32 and the carrier 45 would be small, and thus these two materials can be easily separated from each other. Referring to FIG. 4G, the substrate 10 and the chip 20 encapsulated by the encapsulant 32 are removed from the corresponding opening 46 of the carrier 45, making the carrier 45 separated from a package unit 2 that is to be subjected to a singulation process.

Figure 4H:
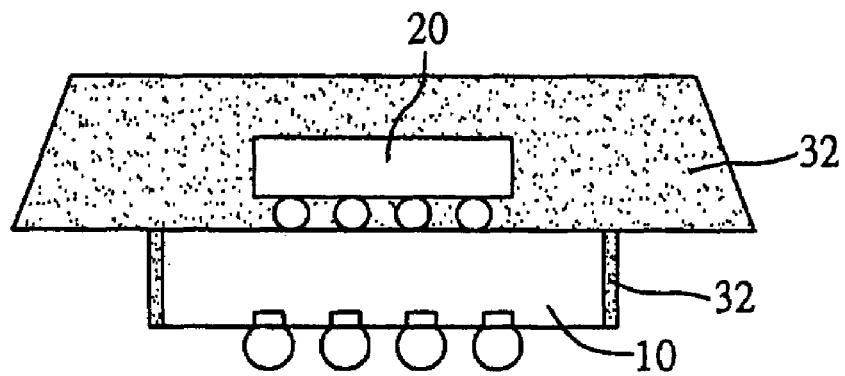
Figure 4I:
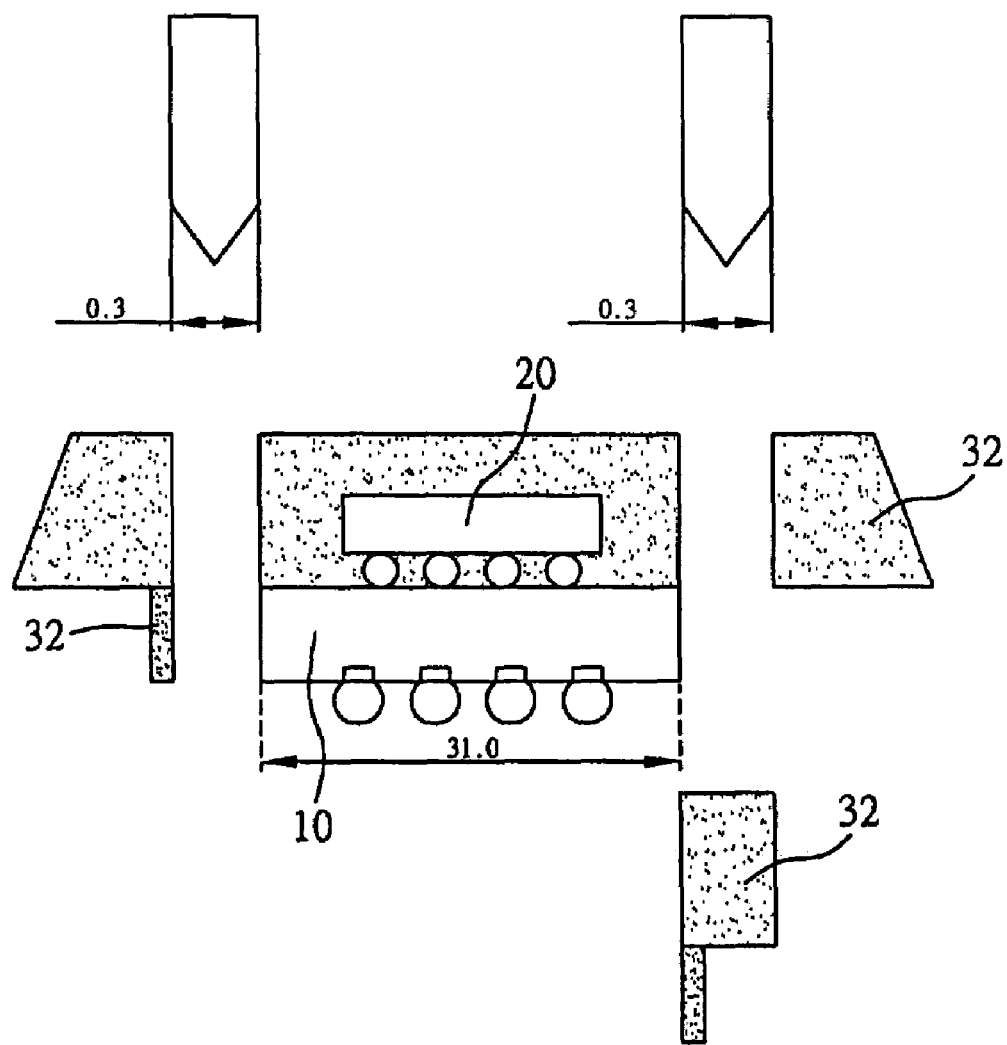
Figure 4J:
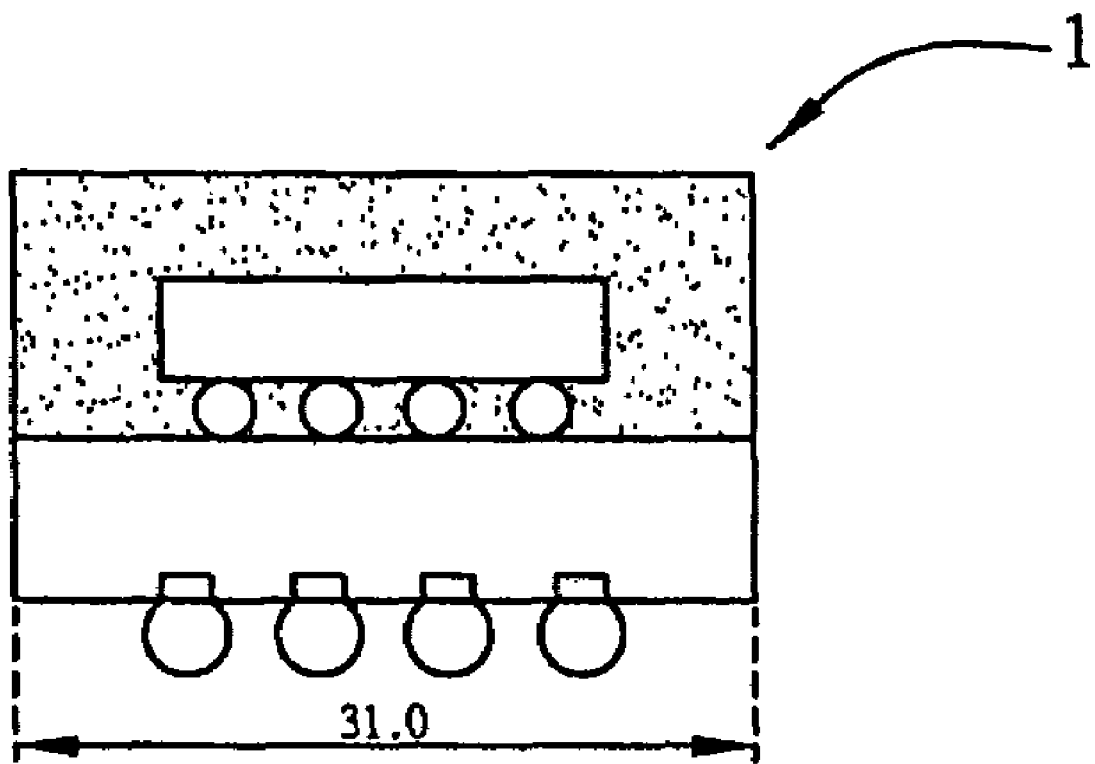

Then, referring to FIGS. 4H, 4I and 4J, a process of implanting solder balls and the singulation process are successively performed similarly as described in the above first embodiment, so as to form a plurality of the semiconductor packages 1 with the predetermined dimensions according to the second embodiment of the present invention. In this embodiment, as the package units 2 can be separated from the carrier 45 before the singulation process, the carrier 45 would not be cut during singulation and thus convenience of fabrication can be further improved.

Third Preferred Embodiment

Figure 5:
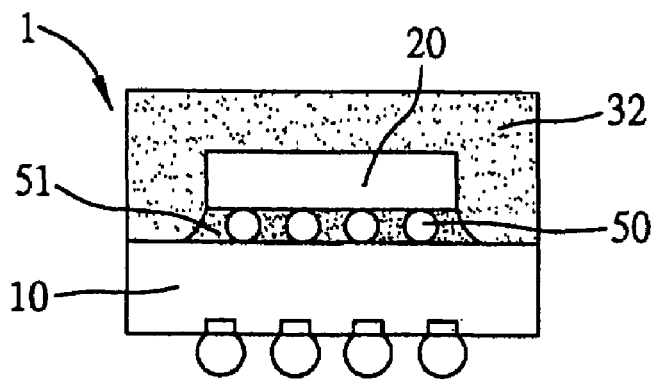
FIG. 5 is a cross-sectional diagram of a semiconductor package fabricated by a method according to a third preferred embodiment of the present invention.

In the foregoing embodiments, the molding process is performed to allow the encapsulant 32 to encapsulate the chip 20 (flip chip) and solder bumps for electrically connecting the flip chip 20 to the substrate 10. However, in this third embodiment, referring to FIG. 5, an underfilling process is carried out to use an underfill material 51 such as epoxy resin to encapsulate the solder bumps 50 and fill a gap between the flip chip 20 and the substrate 10 prior to the molding process. This can further enhance the mechanical strength of the solder bumps 50 and electrical performances of the semiconductor package 1.

Fourth Preferred Embodiment

Figure 6:
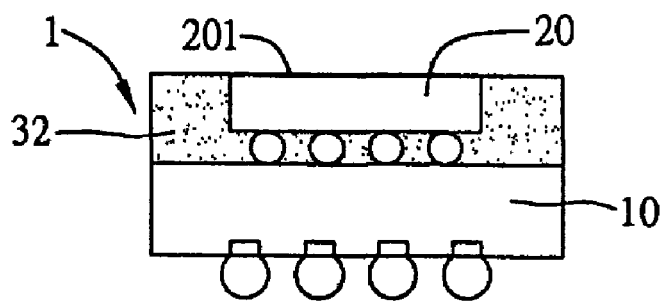
FIG. 6 is a cross-sectional diagram of a semiconductor package fabricated by a method according to a fourth preferred embodiment of the present invention.

In this fourth embodiment, the encapsulant 32 of the semiconductor package 1 can be subjected to a grinding process. Referring to FIG. 6, the encapsulant 32 is ground to expose a non-active surface 201 of the chip 20 from the encapsulant 32, such that the heat dissipating efficiency is improved and the height of the package 1 is further reduced.

Fifth Preferred Embodiment

Figure 7:
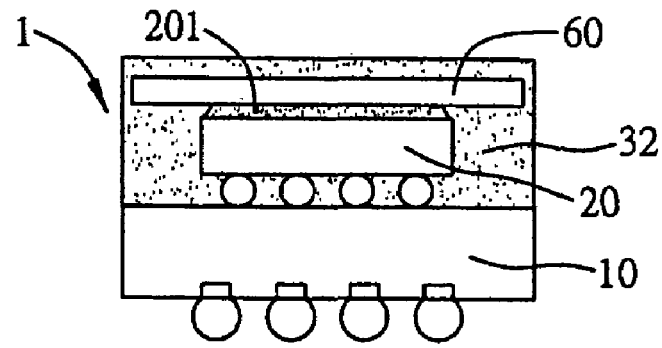
FIG. 7 is a cross-sectional diagram of a semiconductor package fabricated by a method according to a fifth preferred embodiment of the present invention.

Alternatively, in this fifth embodiment, referring to FIG. 7, a heat sink 60 can be attached to the non-active surface 201 of the chip 20 prior to the molding process for forming the encapsulant 32. This can similarly improve the heat dissipating efficiency of the entire package 1.

Sixth Preferred Embodiment

Figure 8:
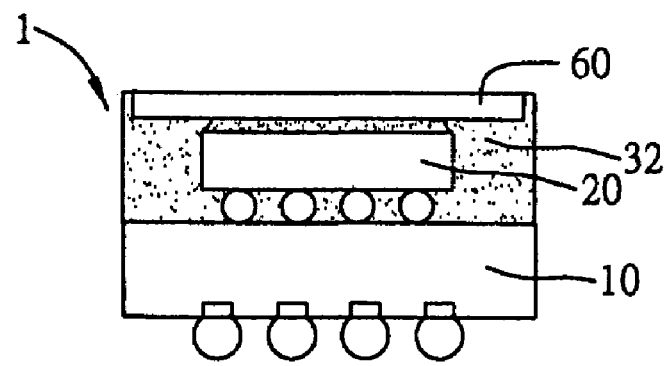
FIG. 8 is a cross-sectional diagram of a semiconductor package fabricated by a method according to a sixth preferred embodiment of the present invention.

In this sixth embodiment, the package 1 shown in FIG. 7 can be subjected to a grinding process so as to remove a portion of the encapsulant 32 located on the heat sink 60. Thus, as shown in FIG. 8, the heat sink 60 is partly exposed from the encapsulant 32 to further improve the heat dissipating efficiency.

Figure 9A:
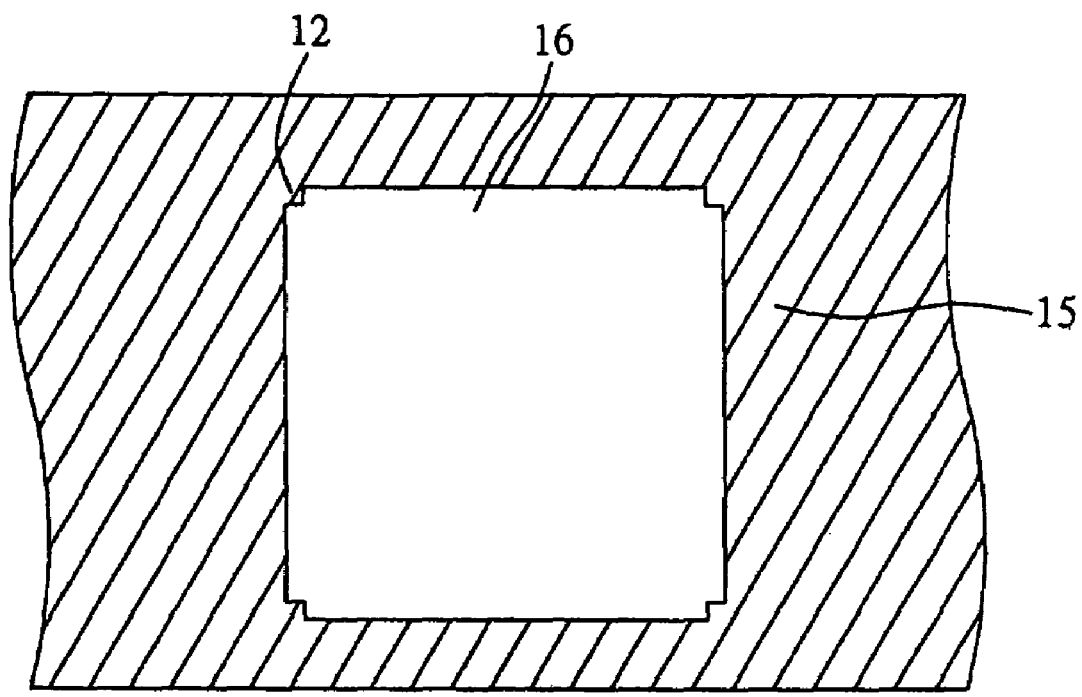
FIGS. 9A and 9B are schematic diagrams of protruded portions according to other preferred embodiments of the present invention.
Figure 9B:
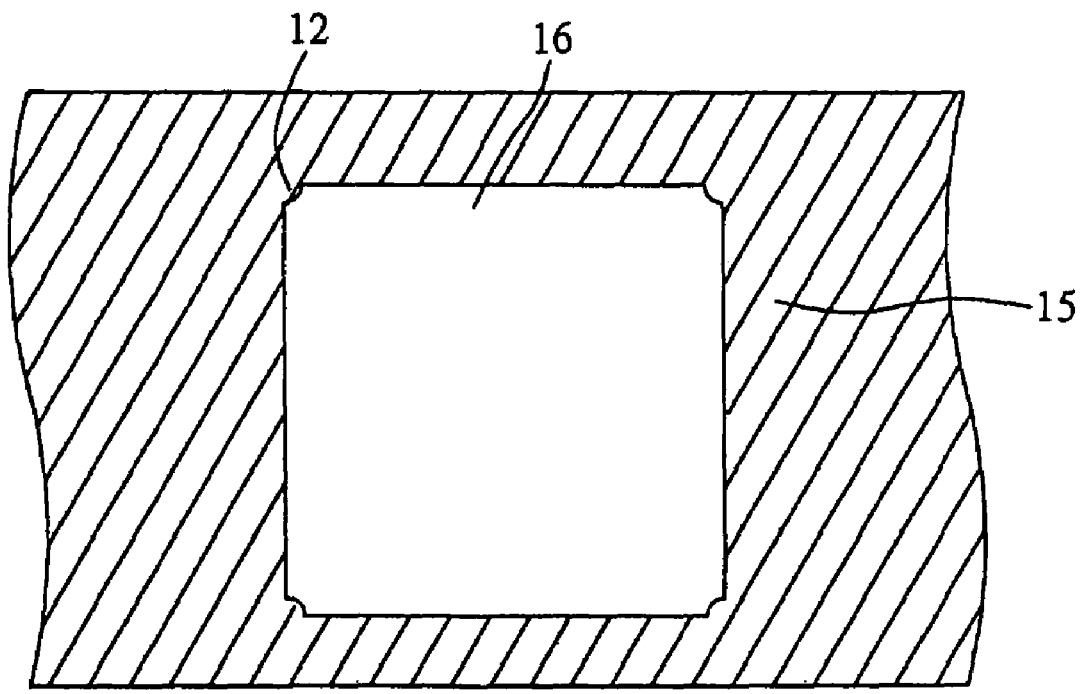
Figure 10:
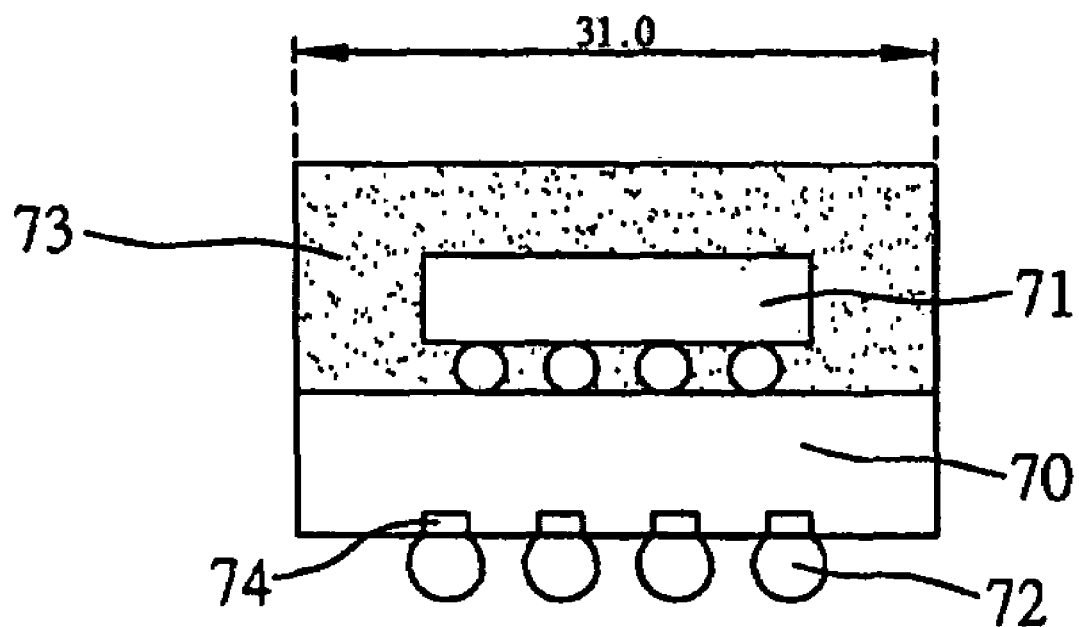
FIG. 10 (PRIOR ART) is a cross-sectional diagram of a conventional FCBGA semiconductor package.
Figure 11:
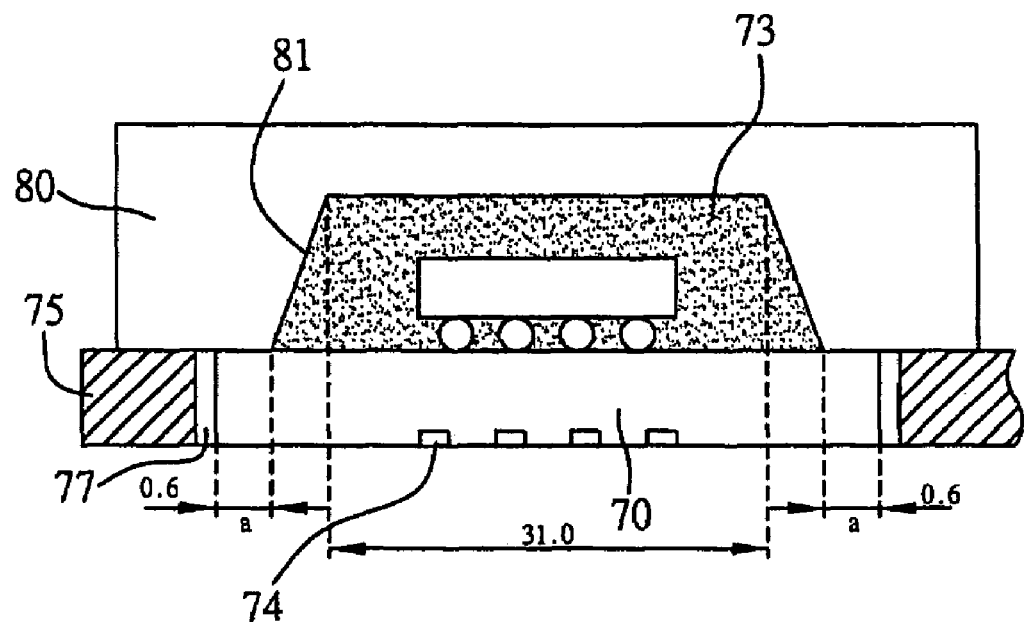
FIGS. 11 and 12 (PRIOR ART) are schematic diagrams showing an increased size of a substrate used in a molding process for the conventional FCBGA semiconductor package.

The fabrication methods and the materials used in the foregoing embodiments may slightly differ from each other. However, all of the embodiments have the same aspect that the length and width of each of the substrates 10 are equal to the predetermined length and width of the semiconductor package 1, and each of the substrates 10 is embedded and fixed in the corresponding opening 16, 46 of the carrier 15, 45 by means of the protruded portions 12 at the corners of the opening 16, 46. It should be noted that, the shape of the protruded portion 12 is not limited to the triangle as above described; alternatively, it can be a rectangle or fan as shown in FIGS. 9A and 9B respectively, or can be any other geometric shapes, which allows the distance between two diagonal protruded portions 12 to be slightly larger than the diagonal length of the substrate 10, making the substrate 10 able to be well embedded and fixed in the opening 16, 46.

Moreover, in the present invention, since the gaps 17, 47 between the substrates 10 and the carrier 15, 45 are sealed, and the coverage of the mold cavity 31 for forming the encapsulant 32 is larger in length and width than the size of the opening 16, 46, the problems of resin flashes and mold-releasing can be solved without having to undesirably increase the size of the substrate 10, such that a material waste of the substrate 10 is eliminated and the material cost thereof is reduced, as well as simplified fabrication processes and an advantage in mass production are provided.

The present invention provides specific designs of dimensions and fabrication processes. It is thus understood that a method of electrical connection for the chip is not particularly limited. Besides being electrically connected to the substrate in a flip-chip manner in the foregoing embodiments, the chip can also be electrically connected to the substrate via bonding wires in the present invention through the use of an appropriate substrate and mold.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating semiconductor packages, comprising the steps of:

preparing a plurality of substrates, wherein a length and width of each of the substrates are equal to a predetermined length and width of each of the semiconductor packages, respectively, and each of the substrates is mounted with at least one chip thereon;

preparing a carrier having a plurality of openings, with a protruded portion of the carrier being formed at each corner position of each of the openings and extending toward a center of each of the openings, wherein a distance between two protruded portions at diagonal corner positions of each of the openings is larger than that between two diagonal corners of each of the substrates;

embedding and fixing the plurality of substrates in the plurality of openings respectively, and sealing gaps between the substrates and the carrier;

performing a molding process to form an encapsulant over each of the openings to encapsulate the corresponding chip, wherein an area on the carrier covered by the encapsulant is larger in length and width than the corresponding opening;

performing a mold-releasing process; and performing a singulation process to cut along edges of the substrates so as to form a plurality of the semiconductor packages.

2. The method of claim 1, further comprising a step of implanting a plurality of solder balls on a surface of each of the substrates after the mold-releasing process.

3. The method of claim 1, wherein the distance between two protruded portions at diagonal corner positions of each of the openings is larger by 0.1–0.2 mm than that between two diagonal corners of each of the substrates.

4. The method of claim 1, wherein the distance between two protruded portions at diagonal corner positions of each of the openings is larger by 0.1 mm than that between two diagonal corners of each of the substrates.

5. The method of claim 1, wherein the protruded portion is shaped as a triangle, a rectangle, or a fan.

6. The method of claim 1, wherein a filling material is filled in and seal the gaps between the substrates and the carrier.

7. The method of claim 1, wherein at least one tape is attached to the substrates and the carrier to seal the gaps between the substrates and the carrier, and the tape is removed after the mold-releasing process.

8. The method of claim 1, wherein the carrier is made of an organic insulating material selected from the group consisting of FR4, FR5 and BT.

9. The method of claim 1, wherein the chip is partly exposed from the encapsulant.

10. The method of claim 1, wherein a heat sink is mounted on a surface of the chip not mounted to the substrate.

11. The method of claim 10, wherein the heat sink is partly exposed from the encapsulant.

12. A method for fabricating semiconductor packages, comprising the steps of:

preparing a plurality of substrates, wherein a length and width of each of the substrates are equal to a predetermined length and width of each of the semiconductor packages, respectively, and each of the substrates is mounted with at least one chip thereon;

preparing a metal carrier having a plurality of openings, with a protruded portion of the metal carrier being formed at each corner position of each of the openings and extending toward a center of each of the openings, wherein a distance between two protruded portions at diagonal corners positions of each of the openings is larger than that between two diagonal corners of each of the substrates;

embedding and fixing the plurality of substrates in the plurality of openings respectively, and sealing gaps between the substrates and the metal carrier;

performing a molding process to form an encapsulant over each of the openings to encapsulate the corresponding chip, such that the corresponding substrate, chip and encapsulant form a package unit, wherein an area on the metal carrier covered by the encapsulant is larger in length and width than the corresponding opening;

performing a mold-releasing process;

separating the package units from the metal carrier; and performing a singulation process to cut along edges of the substrates of the package units so as to form a plurality of the semiconductor packages.

13. The method of claim 12, wherein the metal carrier is made of a copper material.

14. The method of claim 12, wherein a metal layer is plated on a surface of the metal carrier and is poorly adhesive to the encapsulants.

15. The method of claim 14, wherein the metal layer is made of a metal material selected from the group consisting of gold (Au), nickel (Ni) and chromium (Cr).

16. The method of claim 12, further comprising a step of implanting, after the mold-releasing process, a plurality of solder balls on a surface of each of the substrates not having a chip thereon.

17. The method of claim 12, wherein the distance between two protruded portions at diagonal corners of each of the opening is larger by 0.1–0.2 mm than that between two diagonal corners of each of the substrates.

18. The method of claim 12, wherein the distance between two protruded portions at diagonal corner positions of each of the openings is larger by 0.1 mm than that between two diagonal corners of each of the substrates.

19. The method of claim 12, wherein the protruded portion is shaped as a triangle, a rectangle, or a fan.

20. The method of claim 12, wherein a filling material is filled in and seal the gaps between the substrates and the carrier.

21. The method of claim 12, wherein at least one tape is attached to the substrates and the carrier to seal the gaps between the substrates and the carrier, and the tape is removed after the mold-releasing process.

22. The method of claim 12, wherein the chip is partly exposed from the encapsulant.

23. The method of claim 12, wherein a heat sink is mounted on a surface of the chip not mounted to the substrate.

24. The method of claim 23, wherein the heat sink is partly exposed from the encapsulant.

* * * * *